United States Patent [19]
Galli et al.

[11] Patent Number: 5,714,905
[45] Date of Patent: Feb. 3, 1998

[54] LATCH-DOWN-RESISTANT PROTECTION CIRCUITS AND VOLTAGE REGULATOR

[75] Inventors: Giovanni Galli, Galati Marina; Giuseppe Scilla, Pedara, both of Italy

[73] Assignee: Consorzio per la Ricerca sulla Microelettronica nel Mezzogiorno, Catania, Italy

[21] Appl. No.: 549,009

[22] Filed: Oct. 27, 1995

[30] Foreign Application Priority Data

Oct. 27, 1994 [EP] European Pat. Off. .............. 94830502

[51] Int. Cl.⁶ .................................. G05F 1/10; G05F 3/02
[52] U.S. Cl. ........................................ 327/538; 327/540
[58] Field of Search ...................... 361/90, 91; 307/126, 307/130; 327/478, 309, 323, 327, 331, 332, 312, 545, 546, 512

[56] References Cited

U.S. PATENT DOCUMENTS

| | | | |
|---|---|---|---|
| 3,536,958 | 10/1970 | Sondermeyer | 361/79 |
| 4,021,701 | 5/1977 | Davies | 361/18 |
| 4,355,341 | 10/1982 | Kaplan | 361/79 |
| 4,495,537 | 1/1985 | Laude | 361/98 |
| 5,047,988 | 9/1991 | Mizuta | 327/545 |
| 5,130,883 | 7/1992 | Edwards | 361/91 |
| 5,357,089 | 10/1994 | Prentice | 330/298 |
| 5,382,839 | 1/1995 | Shinohara | 327/545 |
| 5,550,462 | 8/1996 | Nakajima | 323/277 |

FOREIGN PATENT DOCUMENTS

| | | |
|---|---|---|
| 0132863 | of 0000 | European Pat. Off. . |
| 2301948 | of 0000 | France . |
| 2476936 | of 0000 | France . |

*Primary Examiner*—Timothy P. Callahan
*Assistant Examiner*—My-Trang Nu Ton
*Attorney, Agent, or Firm*—David V. Carlson; John C. Stewart; Seed and Berry LLP

[57] ABSTRACT

A method, and associated circuit, which can prevent the latch-down phenomenon in transistors which are protected from going out of their SOAs.

By supplementing the first protection circuit (against moving out of the SOA) with a second protection circuit which can drive the control terminal of the transistor such that when, upon the voltage across the main conduction path of the transistor being increased, the value of the current flowing through said path would tend, due to the first protection, to drop below a predetermined lower limit, that value can be kept approximately constant and unaffected by the load as seen from the output terminal of the transistor; the transistor will at all events supply the load with some current up to the acceptable limit VMAX by the transistor.

30 Claims, 6 Drawing Sheets

LATCH-DOWN-RESISTANT PROTECTION CIRCUITS AND VOLTAGE REGULATOR

CROSS-REFERENCE TO RELATED APPLICATION

This application claims priority from EPC App'n 94830502.4, filed Oct. 27, 1994, which is hereby incorporated by reference.

BACKGROUND AND SUMMARY OF THE INVENTION

This invention relates to a method and a circuit effective to prevent the insurgence of the latch-down phenomenon in a transistor protected from moving out of its safe operating area, and to a transistor and voltage regulator utilizing such method and circuit.

All electric devices, in particular transistors of any description (BJT, MOS, . . . ), exhibit a safe operating area (SOA), i.e. a set of operating conditions under which the electric device can operate properly without suffering damages; this area is delimited by boundary conditions.

In many applications, the electric devices are operated well within such boundary conditions; but a field to which this does not apply is, for example, that of power transistors, where it is of the utmost importance that the device be utilized to its full capacity but, of course, without going beyond their boundary conditions and, consequently, damaging them.

To this aim, power transistors are often associated with protection circuits to prevent them from moving out of their SOA; a typical protection of this kind is that concerned in the maximum dissipable power. With transistors of the BJT (Bipolar Junction Transistor) type, a much more restrictive limitation to high voltages is posed by secondary breakdown. Additional limitations come from the largest currents and/or voltages that the devices can withstand.

Overstepping the boundary conditions may be acceptable occasionally and for short time periods, or for a small proportion of the normal operation time.

Power transistors are employed, for example, as output regulating elements in voltage regulators, both of the integrated and the discrete component varieties.

Shown in FIG. 1 is a simplified block diagram of a conventional linear voltage regulator. Indicated at PT is the power transistor, which has an input terminal IT, an output terminal OT, and a control terminal CT, the protection circuit against departure from the SOA being denoted by PC1.

This is a linear regulator, where the pass transistor is operated in an analog mode. (Such regulators may be particularly attractive for applications where the presence of switching noise is undesirable.) Since SOA heat dissipation in the power transistor is relatively high in this configuration (as compared to switching regulators), the disclosed inventions can make linear regulators much more attractive.

The regulator has a voltage input terminal VIN, a voltage output terminal VOUT, and a ground terminal GT. The terminal VIN is connected to the terminal IT of the transistor PT, and the terminal VOUT is substantially connected to the terminal OT of the transistor PT.

Connected between the terminals VIN and GT is a reference voltage generator RVG, and connected between the terminals VOUT and GT is a voltage divider VD effective to generate a voltage which is substantially proportional to the voltage at the regulator output. The outputs of the generator RVG and the divider VD are connected to the inputs of an error amplifier EA whose output is connected to the terminal CT.

It is this set of blocks that provide the proper regulating capability. The amplifier EA outputs an electric signal of such an amplitude that the voltages generated by the generator RVG and the divider VD will have substantially the same value; of course, the voltage generated by the generator RVG would be constant, whereas the voltage generated by the divider VD would be dependent on the voltage drop attained by the transistor PT along its main conduction path from the terminal IT to the terminal OT, relative to the electric signal being input to its control terminal CT.

Arranged in series with the main conduction path of the transistor PT is a sensing resistor RS which has a fairly small value in order not to downgrade the regulator performance. The voltage across RS is proportional to the current absorbed by any load connected to the regulator output.

The circuit PC1 has four terminals respectively connected to the voltage input terminal VIN, the voltage output terminal VOUT, and the output and control terminals of the transistor PT.

A commercially available integrated regulator may include additional blocks, not shown in FIG. 1, serving auxiliary or supplementary functions.

Shown in FIG. 2 is a circuit diagram for a typical prior art embodiment of the protection circuit PC1 as connected to the transistor PT, of the BJT type in the Figure, and the resistor RS.

The sense resistor RS is connected in series with the emitter—the output terminal OT—of the transistor PT. The voltage across the resistor RS is applied to the base-emitter junction of a feedback transistor QF through the feedback resistor RF, connected to its base. The base of the transistor QF is also connected to the collector—the input terminal IT—of the transistor PT through the series connection of a zener diode DZ and a zener resistor RZ, while its collector is connected to the base—the control terminal CT—of the transistor PT.

FIG. 3 shows, on a graph of the collector current IC versus the collector-emitter voltage VCE, the SOA of the transistor PT (the scales used being logarithmic for both the abscissa and the ordinate axes) bounded by a curve BL; IMAX and VMAX respectively denote the maximum current and voltage that the transistor PT can withstand; also shown are possible limits to the circuit PC1 operation by the curves C1, C2, C3, C4, which are essentially straight lines.

The start point of such curves is substantially established by the diode DZ and can be set with high accuracy.

Their gradient is given approximately by $-RF/(RS*RZ)$. Such resistances usually have different magnitudes (e.g. RZ=10 kOhm, RF=300 Ohm, RS=0.3 Ohm), and should a variation occur, for instance in the technological process (IC fabrication process), then a departure would occur in that ratio from the desired value because of the appearance of a product in the denominator of the ratio. Further, even when the resistance RS is considered to be more stable (being usually obtained by an emitter diffusion) than the other two (usually obtained by base diffusions), there would remain for consideration the ratio of RF to RZ which, due to the resistances having different magnitudes, is difficult to provide in any stable fashion on account of the impossibility of attaining a match between the two resistances on silicon (and the more so if the formation of the circuit using discrete components were attempted).

As is apparent from FIG. 3, identical circuits formed in the same way may easily perform differently, e.g. along the four curves C1, C2, C3, C4, which are not fully contained within the SOA as desired.

To avoid this problem, it has been common practice to select a desired operation curve, e.g. the curve C2, far removed from the curve BL, so that the operation curve of the protection circuit would at all events lie within the SOA, e.g. somewhere between the curves C1 and C3.

However, this practice involves a considerable underutilization of the capabilities of transistor PT, resulting in it being significantly oversized.

A particularly troublesome phenomenon, also connected with such practice (tied to protection circuits), is the so-called latch-down, i.e. the fact that, at high voltages and despite the load demand, the current being output from the transistor is virtually null. This phenomenon corresponds, for example, to the V2-VMAX segment of the curve C2 in FIG. 3. Even though the transistor is able to supply significant current while remaining within the SOA, this fails to be the case because of the control action of the protection circuit.

One would think that improved utilization of the SOA of the transistor could theoretically be achieved by using a protection circuit which has an operation limit represented by a curve geometrically more closely resembling the curve BL (boundary of the SOA), such as that designated C4M in FIG. 4. Such a curve, which may be regarded as a modification of the curve C4 in FIG. 3, can be obtained by the use of a protection circuit similar to that shown in FIG. 2 but having, in parallel with the pair of devices DZ, RZ, a pair which are similar to these but exhibit a higher zener voltage.

Actually, this modification would inherently have the same disadvantages as the original approach. In fact, possible variations in the electric parameters of the circuit would forcibly lead to selecting a desired operation curve far removed from the curve BL in order to avoid obtaining a protection circuit which has a clearly unacceptable operation curve such as that denoted by C5 in FIG. 4. In addition, the latch-down phenomenon would still be there and correspond, for example, to the V4M-VMAX segment of the curve C4M.

It is the object of this invention to provide a method, and associated circuit, which can prevent the latching-down of transistors protected from going out of their SOAs.

This object is substantially achieved by a method for preventing the occurrence of the latch-down phenomenon in a transistor protected from moving out of its safe operating area (BL), when the value of the current (IC) flowing through the main conduction path of the transistor tends, because of that protection, to drop below a predetermined lower limit (ISC) as the voltage (VCE) across the path increases, a control action is applied to the control terminal of the transistor which keeps that value approximately constant and unaffected by the load as seen from the output terminal of the transistor.

The above objects are also substantially achieved by a circuit for preventing the occurrence of the latch-down phenomenon in a transistor (PT) protected from moving out of its safe operating area by a protection circuit, comprising: a detector (RS) effective to detect the current which is flowing through the main conduction path (IT-OT) of the transistor (PT), and control circuitry CM effective to drive the control terminal (CT) of the transistor (PT) such that, when upon the voltage across the path (IT-OT) being increased the value of the current flowing through the path tends, because of that protection, to drop below a predetermined lower limit, that value is kept approximately constant and unaffected by the load as seen from the output terminal (OT) of the transistor.

The invention also relates to a transistor and a voltage regulator wherewith this circuit can be used to advantage.

By supplementing the first protection circuit (against the moving out of the SOA) with a second protection circuit which can drive the control terminal of the transistor such that when, upon the voltage across the main conduction path of the transistor being increased, the value of the current flowing through the path would tend—due to the first protection—to drop below a predetermined lower limit, that value can be kept approximately constant and unaffected by the load as seen from the output terminal of the transistor so the transistor will at all events supply the load with some current up to the acceptable limit VMAX by the transistor.

Since the current ISC is relatively low, the boundary BL of the SOA, at the current value ISC, will be determined predominantly by the maximum voltage VMAX. (Thus, as seen in FIG. 5, the boundary of the SOA is approximately vertical where it intersects the horizontal line with current value ISC.)

BRIEF DESCRIPTION OF THE DRAWINGS

The invention can be more clearly understood from the following description in conjunction with the accompanying drawings, in which.

DETAILED DESCRIPTION OF THE PREFERRED EMBODIMENTS

The method of this invention will be described hereinafter with reference to FIG. 5.

Shown in that Figure is a collector current IC versus collector-emitter voltage VCE graph bringing out the SOA of the transistor PT, bounded by the curve BL; IMAX and VMAX respectively designate the maximum current and voltage that the transistor PT can withstand; and curves C1, C2, C3 show possible operation limits for the circuit PC1, such as may result from the uncontrollable manufacturing variation in the parameters of the devices which make up the circuit.

According to this method for preventing the occurrence of the latch-down phenomenon in a transistor protected from moving out of its safe operating area BL, when the value of the current IC flowing through the main conduction path of the transistor tends, because of that protection, to drop below a predetermined lower limit ISC as the voltage VCE across said path increases, a control action is applied to the control terminal of the transistor which keeps that value approximately constant and unaffected by the load as seen from the output terminal of the transistor.

That value is advantageously held until the value of the voltage VCE across said path exceeds an upper breakdown limit VMAX of the transistor.

Advantageously, when the value of the current IC flowing through said path tends to rise above said predetermined lower limit ISC, e.g. because of a decrease in VCE, the control action is discontinued.

This control action is only applied when the voltage value across that path lies above a lower operation limit VT.

Figure 5:
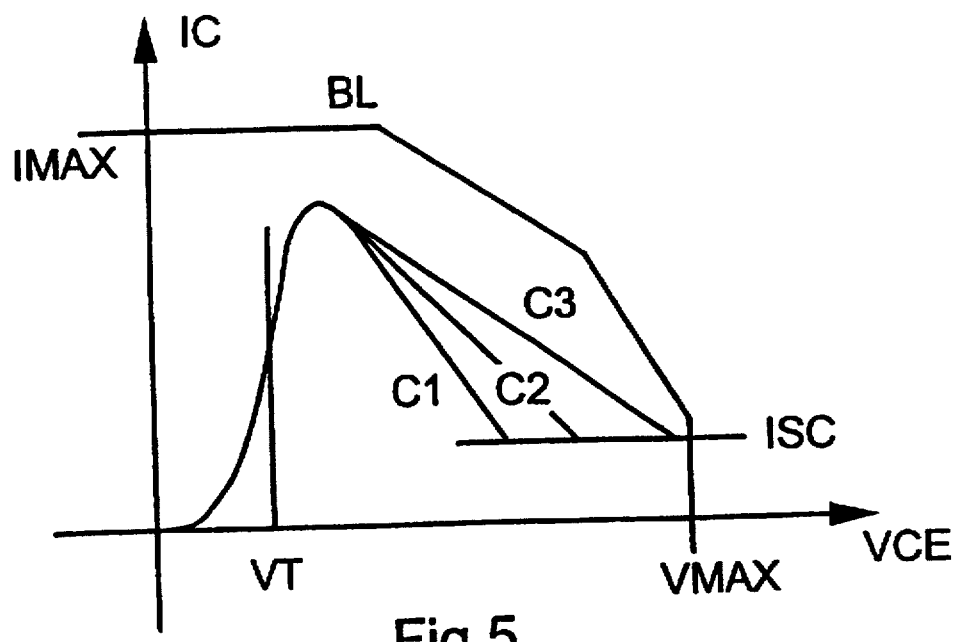
FIG. 5 is a log plotting of current vs. voltage showing the SOA of a transistor and the operation curve of a conventional protection circuit as modified by the action of a circuit according to this invention.

As can be seen in FIG. 5, regardless of the gradient of the operation curve, the minimum current is ensured at the "high" voltages by the curve ISC, thereby completely avoiding the latch-down phenomenon up to the limit VMAX, above which the transistor PT would be in risk of damage anyhow.

By the use of this method, the capabilities of the transistor PT can be better utilized because the usable working area now available is larger than that of no protection against latching-down, and yet sufficiently removed from the SOA boundaries BL.

The circuit of this invention will now be explained with reference to FIG. 6.

This circuit for preventing the occurrence of the latch-down phenomenon in a transistor PT protected from moving out of its safe operation area by a protection circuit comprises:

a) a detector means RS effective to detect the current which is flowing through the main conduction path IT-OT of the transistor PT, and b) a control means CM effective to drive the control terminal CT of the transistor PT such that, when upon the voltage across the path IT-OT being increased the value of the current flowing through said path tends, because of that protection, to drop below a predetermined lower limit, that value is kept approximately constant and unaffected by the load as seen from the output terminal OT of the transistor.

Figure 6:
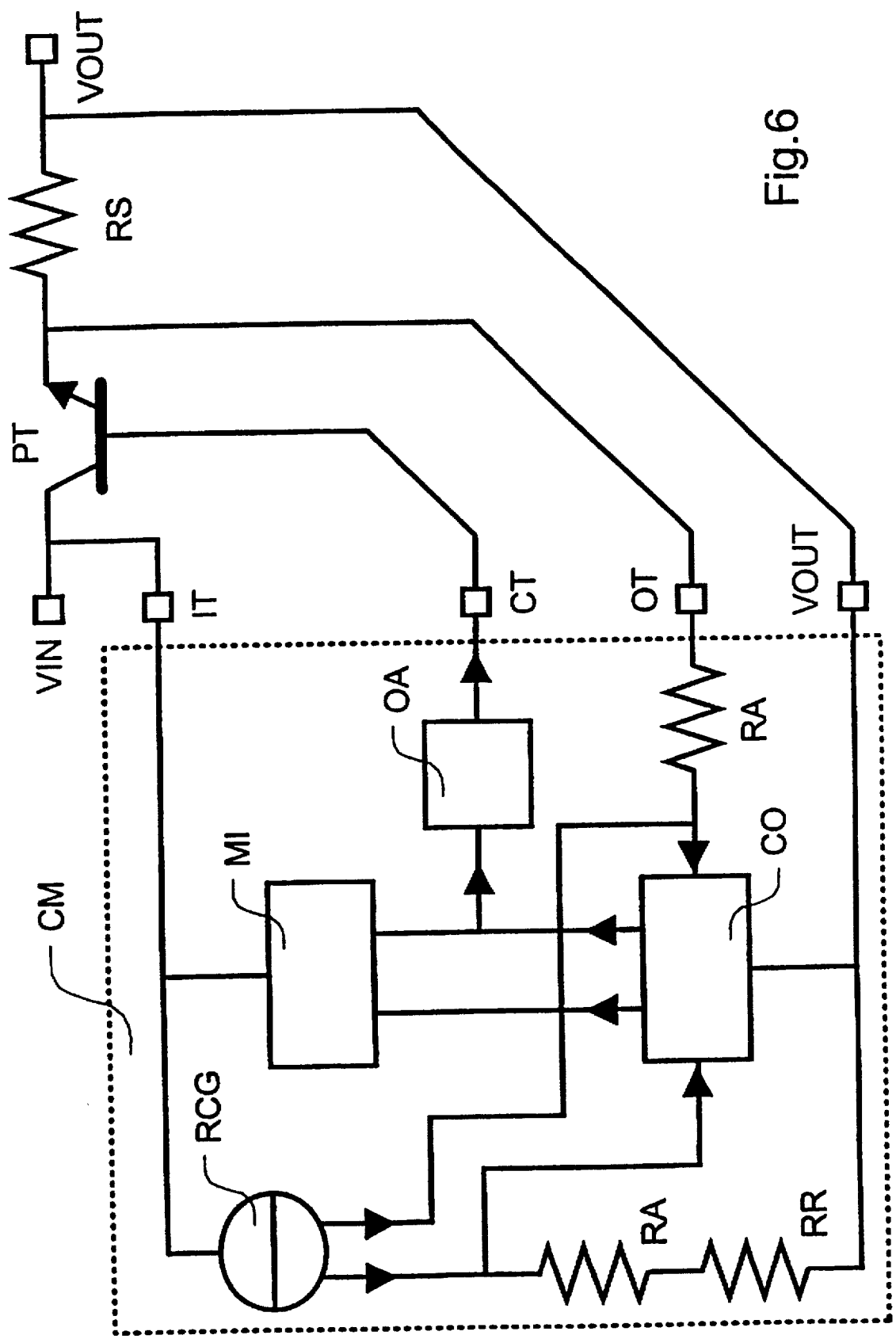
FIG. 6 is a block diagram of a circuit according to this invention.

In FIG. 6, the detector means is very simply implemented in the form of a detection resistor RS arranged in series with the path IT-OT and having a fairly small value not to impair the transistor PT performance; in this case, the voltage across the resistor RS is substantially proportional to the current flowing through the main conduction path IT-OT of the transistor PT.

In a simple, yet effective, embodiment, the control means CM comprises:

a) a reference current generator RCG;

b) a reference resistor RR connected to the output of the current generator RCG;

c) a voltage comparator CO of the type having a current differential output and inputs respectively coupled to the output of the detector means and the terminals of the reference resistor RR;

d) a current mirror MI connected to the outputs of the comparator CO; and e) an output stage OA having an input connected to one of the comparator CO outputs and an output coupled to the control terminal CT of the transistor PT.

To provide bias for the comparator CO and pre-charge it against the occurrence of such decrease, it may advantageously be arranged for the reference current generator RCG to generate two substantially identical currents at two outputs thereof which are respectively connected to the two inputs of the comparator CO, and for two bias resistors RA to be respectively placed in series with the output of the detector means which have substantially the same resistive value; this, of course, in the assumed case that the signal from the detector means is a voltage signal.

It would be advantageous indeed if the control means CM is supplied essentially the voltage across the path IT-OT, so that no auxiliary power supply arrangement is required, and this is limited to the protection circuit.

The control means is best operated only when required, or at least not operated when unnecessary. To this aim, the generator RCG can be designed, for example, to only generate a current when the voltage value across the path IT-OT is above a lower operation limit.

Figure 7:
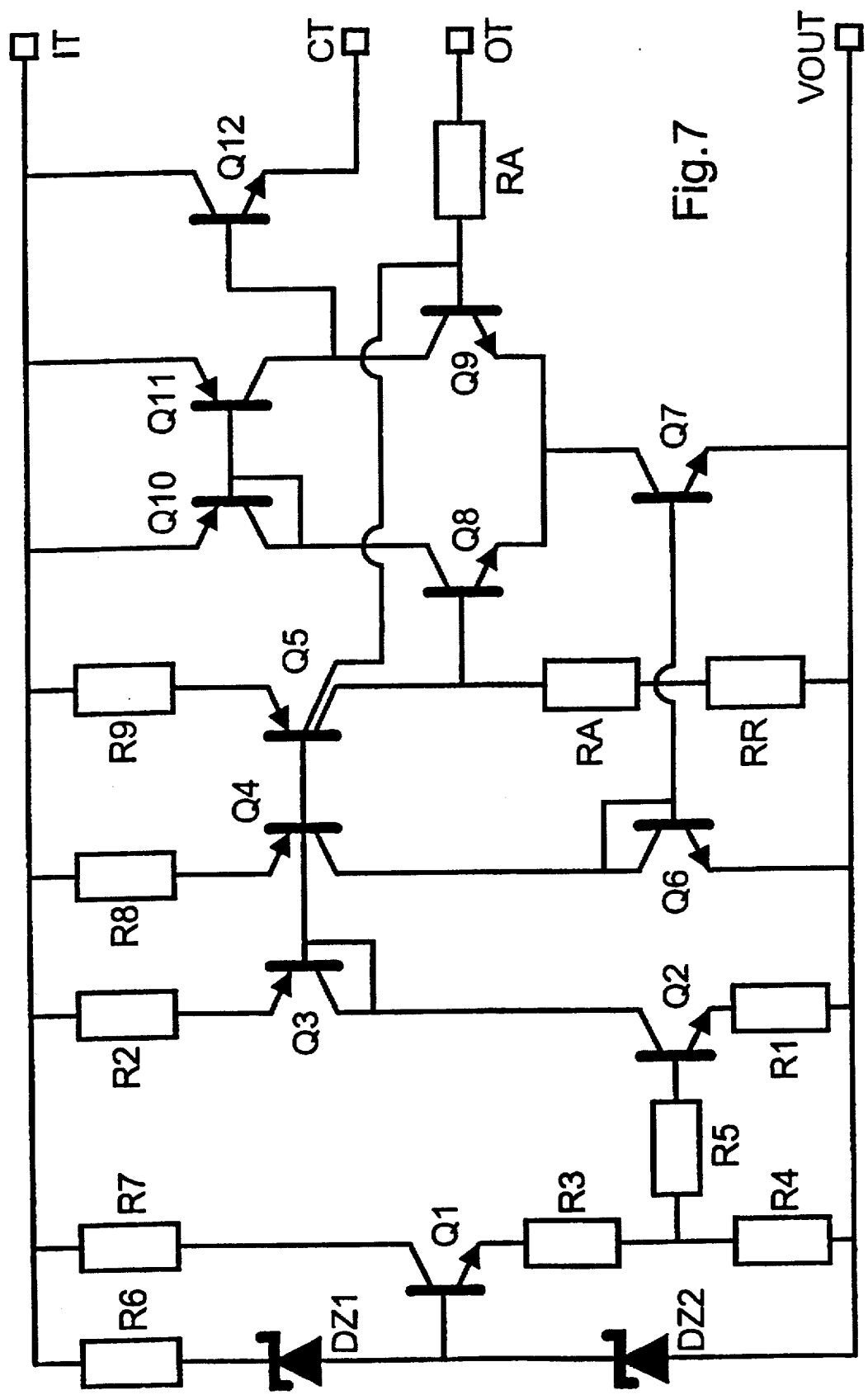
FIG. 7 is a possible circuit diagram of the control means included in the block diagram of FIG. 6.

In FIG. 7, a possible circuit arrangement is shown for the control means already depicted in block form in FIG. 6, which circuit is suitable for integration into a chip.

The terminal VOUT is connected to the circuit ground, and the terminal IT is connected to the circuit power supply; the terminal OT is the voltage input of the circuit, and the terminal CT is the circuit current output.

In this order from left to right, there are provided two zener diodes DZ1 and DZ2, being in series with each other and connected between ground and the power supply through a resistor R6; the center tap of the serial connection is taken to the base of a transistor Q1 of the NPN type; the collector of the transistor Q1 is connected to the power supply through a resistor R7, and its emitter is connected to ground through the serial connection of two resistors R3 and R4; the center tap of the last-mentioned connection is taken to the base of a transistor Q2 of the NPN type through a resistor R5; and the emitter of the transistor Q2 is connected to ground through a resistor R1, while its collector is connected to a multiple current mirror.

This multiple current mirror consists of three transistors Q3, Q4, Q5 of the PNP type, of which Q5 has a dual collector; their emitters are connected to the power supply through three resistors R2, R8, R9, respectively, which have the same value, in particular coincident with the value of R1; their bases are all connected together; the collector of the transistor Q3 is connected to its base and the collector of the transistor Q2; the collectors of the transistors Q4 and Q5 form the three outputs of the mirror; the area ratios of the three transistors are such that the output current of the collector of Q4 is twice as large as the output current of each collector of Q5.

The collector of Q4 is, in turn, connected to another current mirror comprised of two transistors Q6 and Q7 of the NPN type whose emitters are connected directly to ground, with Q6 being connected in a diode configuration; the mirror output is represented by the collector of the transistor Q7.

The circuit of FIG. 6 further includes a pair of transistors Q8 and Q9 of the NPN type connected into a differential configuration with inputs at their bases and outputs at their collectors; their emitters are connected together and to the collector of the transistor Q7; their bases—the differential inputs—being connected to the two collectors of the transistor Q5. Also, the base of Q8 is connected to ground through the serial connection of two resistors RA and RR, and the base of Q9 is connected to the terminal OT through a resistor RA, the value of RR being selected to be equal to that of R1.

The differential outputs are connected to a current mirror which comprises two transistors Q10 and Q11 having their emitters connected directly to the power supply, while the collector and base of Q10 are connected together.

Finally, the circuit comprises a transistor Q12 of the NPN type which has its base connected to the collector of Q11, its collector connected directly to the power supply, and its emitter connected to the terminal CT.

A current Iref is only generated at the collector of the transistor Q2 when the difference in potential between the terminal IT and the terminal VOUT is larger than the combined zener voltages of the diodes DZ1 and DZ2, which corresponds substantially to the voltage VT shown in FIG. 5. This current is given by:

$$Iref=((VDZ2-VBEQ1)*R4/(R3+R4)-VBEQ2)/RR.$$

Through a series of current "mirrorings", one obtains:

$$VBEQ9=(Iref/2)*RA+(Iref/2)*RR-VCEQ7,$$

$$VBEQ10=(Iref/2)*RA+IL*RS-VCEQ7,$$

where, IL is the current flowing substantially through the main conduction path of the transistor PT.

It can be easily shown that the transistor Q12 will only drive the transistor PT if:

$$IL<Iref*RR/2*RS;$$

which product corresponds to ISC in FIG. 5.

When the operation of the protection circuit against moving out of the SOA and that of the protection circuit against latching-down are considered together, it is important that they should not interfere with each other, and accordingly, it is preferred that only one of them be acting on the transistor PT at any one time.

Of course, there will be a current value range wherein they are both acting, but it will of advantage if this range is kept as small as possible.

It could be arranged for a transistor, in particular a power transistor, a first protection circuit against moving out of the safe operation area thereof, and a second protection circuit against latching-down, according to this invention, to be all integrated to the same chip. In this way, a transistor can be provided which has the same characteristics as the original one, but is "self-protected" and, therefore, less likely to be damaged.

Figure 8:
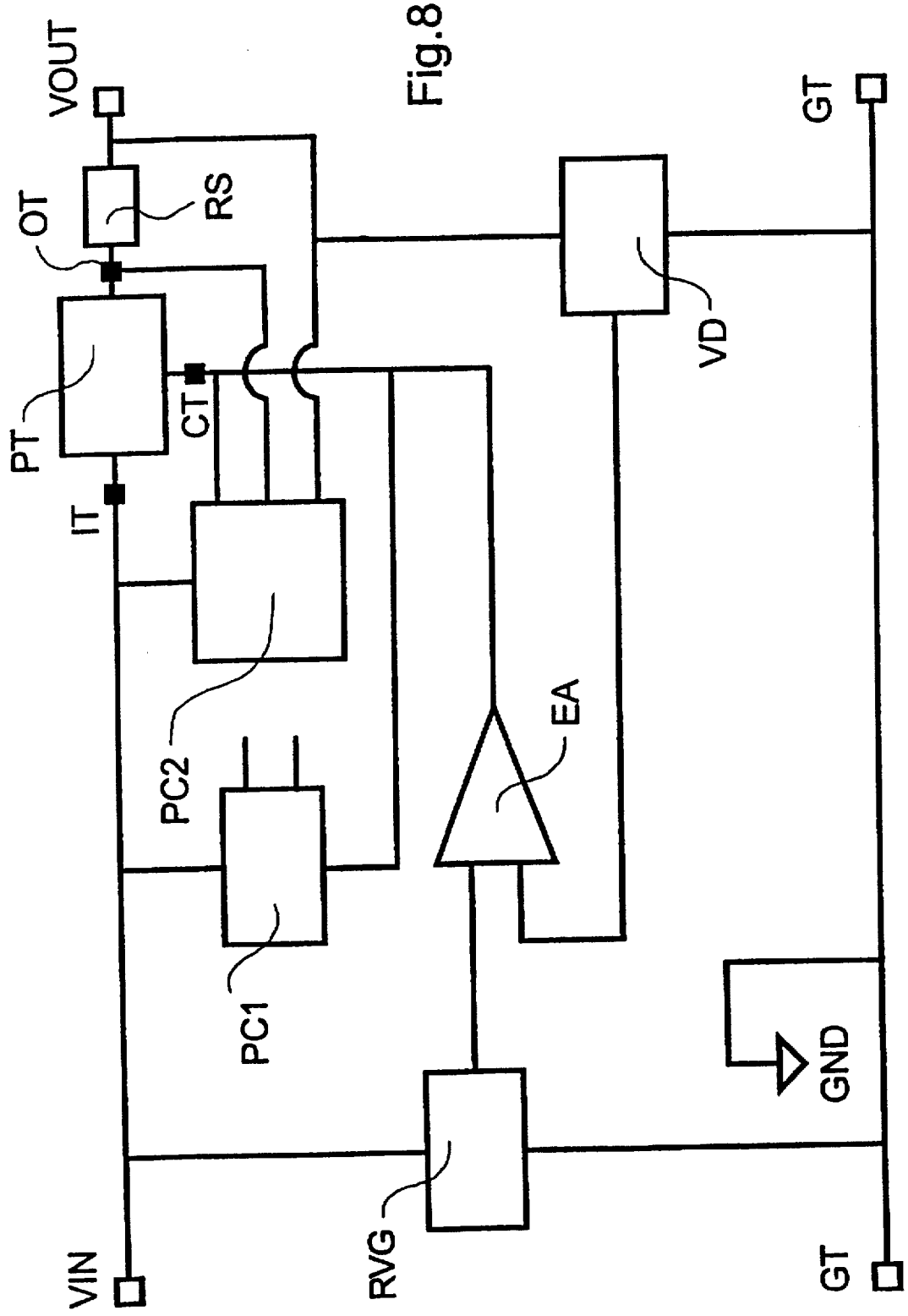
FIG. 8 is a simplified block diagram of a voltage regulator according to this invention and including the circuit of FIG. 6.

Finally, shown in FIG. 8 is a simplified block diagram of a voltage regulator according to this invention.

Figure 1:
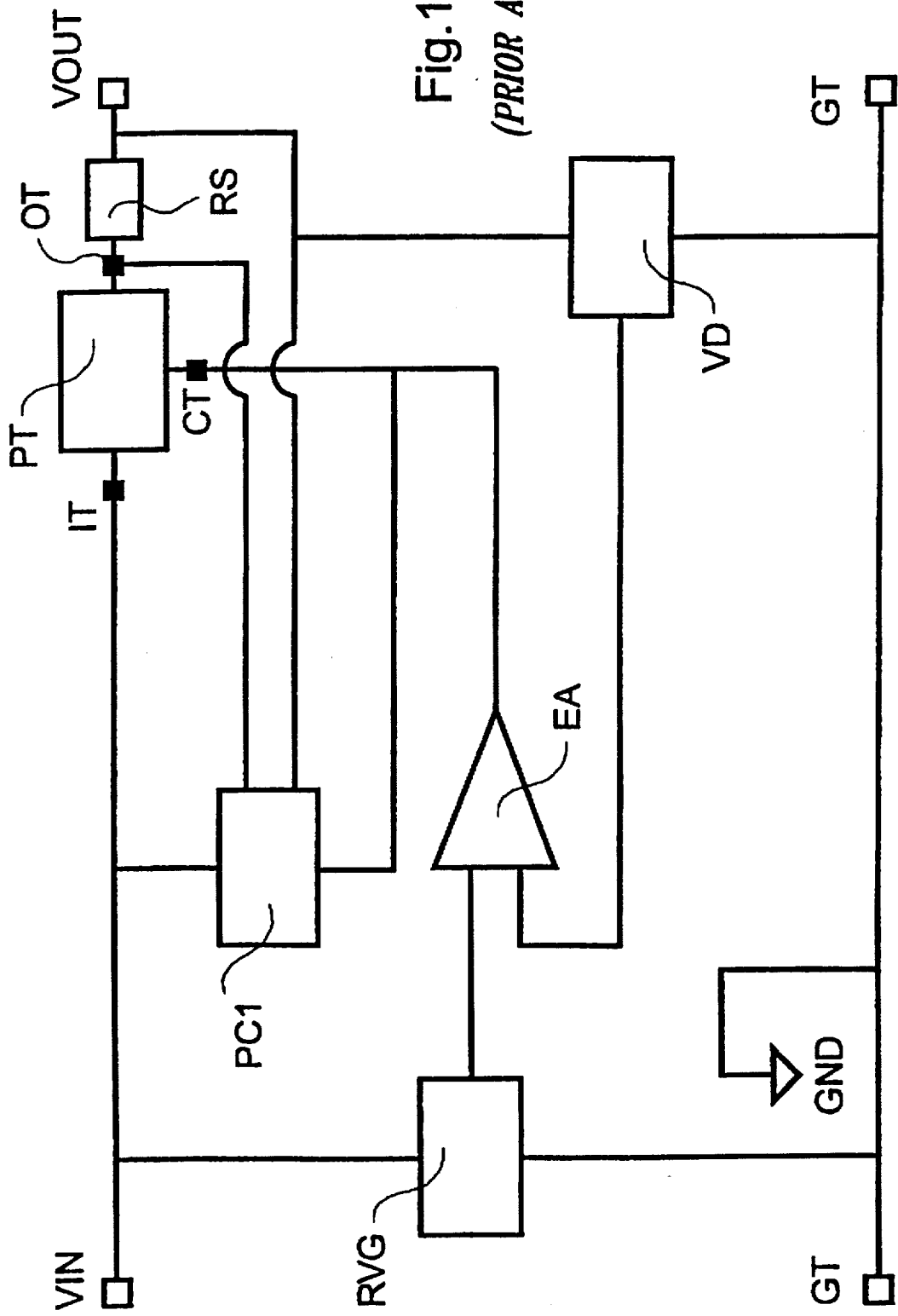
FIG. 1 is a simplified block diagram of a prior art voltage regulator.
Figure 2:
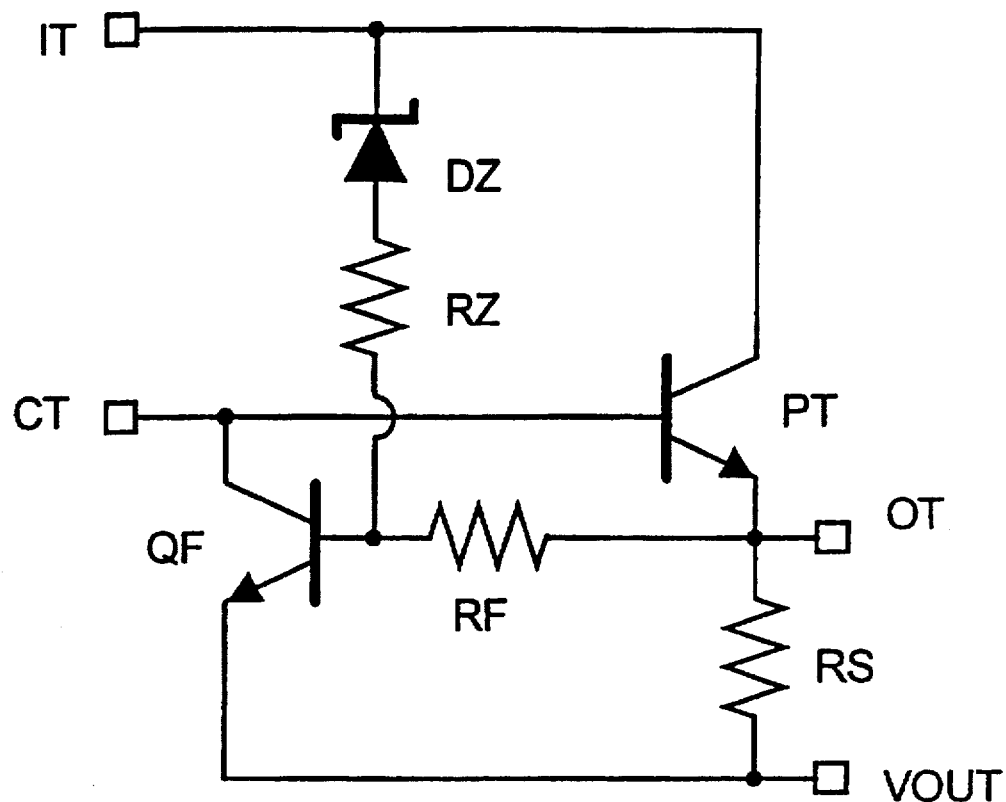
FIG. 2 is a circuit diagram of a prior art embodiment of a protection circuit.
Figure 3:
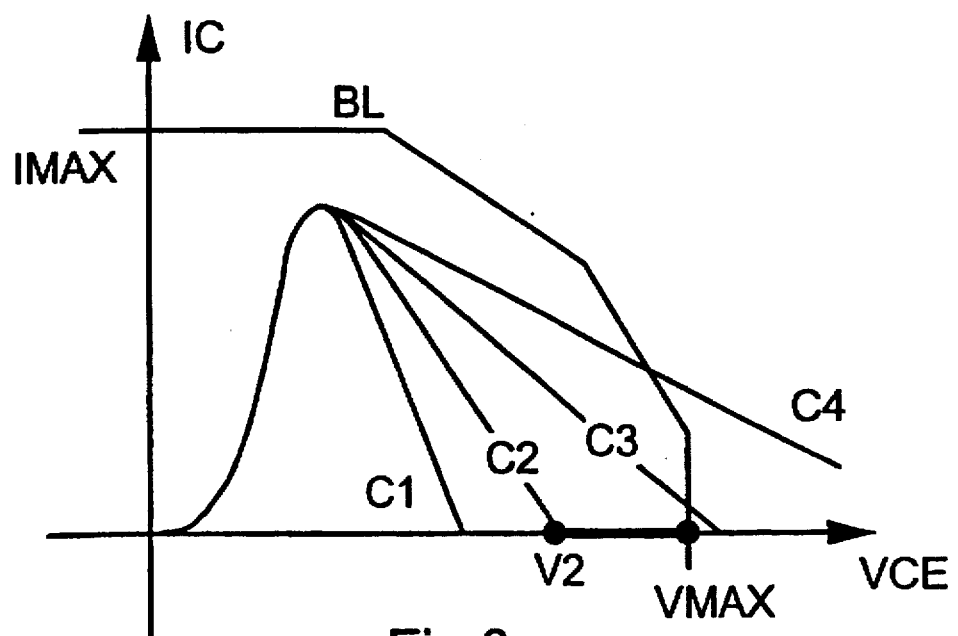
FIG. 3 is a log plotting of current vs. voltage showing the SOA of a transistor and the operation curve of the protection circuit of FIG. 2.
Figure 4:
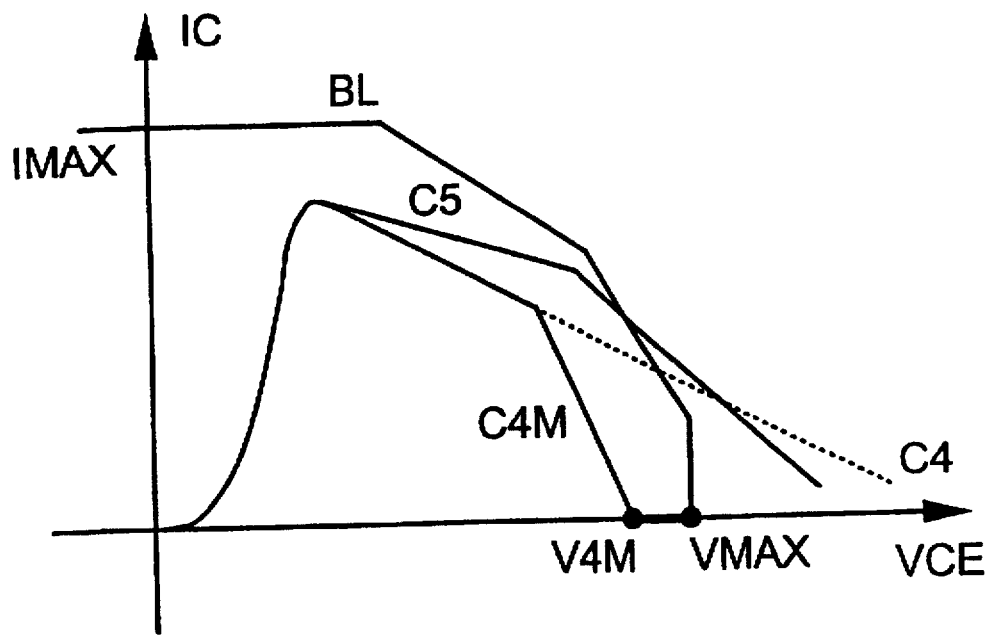
FIG. 4 is a log plotting of current vs. voltage showing the SOA of a transistor and the operation curve of a protection circuit being a modification of that shown in FIG. 2.

This is identical with the block diagram shown in FIG. 1, with the exception of the presence of another protection circuit against latching-down, PC2, according to this invention. The circuit of FIG. 8 is shown, for clarity of illustration, without the connections of two terminals of the circuit PC1, but these would be identical with those of FIG. 1.

The circuit PC2 has four terminals respectively connected to the three terminals IT, CT, OT of the transistor PT and to the terminal VOUT; the block diagram of the circuit PC2 may be that shown in FIG. 6, for example.

According to a disclosed class of innovative embodiments, there is provided: A method for preventing the occurrence of the latch-down phenomenon in a transistor protected from moving out of its safe operating area (BL), when the value of the current (IC) flowing through the main conduction path of the transistor tends, because of that protection, to drop below a predetermined lower limit (ISC) as the voltage (VCE) across said path increases, a control action is applied to the control terminal of the transistor which keeps that value approximately constant and unaffected by the load as seen from the output terminal of the transistor.

According to another disclosed class of innovative embodiments, there is provided: A circuit for preventing the occurrence of the latch-down phenomenon in a transistor (PT) protected from moving out of its safe operating area by a protection circuit, comprising: a) a detector means (RS) effective to detect the current which is flowing through the main conduction path (IT-OT) of the transistor (PT), and b) a control means CM effective to drive the control terminal (CT) of the transistor (PT) such that, when upon the voltage across said path (IT-OT) being increased, the value of the current flowing through said path tends, because of that protection, to drop below a predetermined lower limit, that value is kept approximately constant and unaffected by the load as seen from the output terminal (OT) of the transistor.

According to another disclosed class of innovative embodiments, there is provided: A method for operating a bipolar transistor, comprising the steps of: (a.) monitoring voltage and current across the transistor; (b.) if the current across the transistor exceeds a predetermined maximum current, turning off the transistor; (c.) if the voltage across the transistor exceeds a predetermined maximum voltage, turning off the transistor; (d.) if conditions (b.) and (c.) do not obtain, and if the voltage and current across the transistor violate a safe-operating-area relationship which is defined by a hardware subcircuit, then partially turning off the transistor, to bring the current across the transistor to a predetermined non-zero minimum level.

According to another disclosed class of innovative embodiments, there is provided: A method for operating a bipolar transistor, comprising the steps of: (a.) monitoring voltage and current across the transistor; (b.) if the current across the transistor exceeds a predetermined maximum current, turning off the transistor; (c.) if the voltage across the transistor exceeds a predetermined maximum voltage, turning off the transistor; (d.) providing emitter, base, and collector voltages from the transistor to a protection circuit, which provides an output signal which indicates whether a violation of a safe-operating-area relationship has occurred; and if the output signal indicates that a violation of a safe-operating-area relationship has occurred, then partially turning off the transistor, to bring the current across the transistor to a predetermined non-zero minimum level.

According to another disclosed class of innovative embodiments, there is provided: An integrated circuit, comprising: a bipolar power transistor; a first protection circuit connected to monitor voltage and current across the transistor, and to attempt to turn off the transistor if the current across the transistor exceeds a predetermined maximum current, or if the voltage across the transistor exceeds a predetermined maximum voltage, or if the voltage and current across the transistor jointly violate a predetermined safe-operating-area relationship; and a second protection circuit connected to monitor voltage and current across the transistor, and to drive the transistor at a predetermined non-zero minimum current level if the first protection circuit is attempting to turn the transistor off while the voltage across the transistor is less than the predetermined maximum voltage; the transistor and the protection circuits all being integrated together.

According to another disclosed class of innovative embodiments, there is provided: An integrated circuit for controlling a power bipolar transistor which has a current-sensing resistor in series therewith, comprising: connections for the emitter, base, and collector of the power transistor, and for the current-sensing resistor; a first protection circuit connected to monitor voltage and current across the transistor, and to attempt to turn off the transistor if the current across the transistor exceeds a predetermined maximum current, or if the voltage across the transistor exceeds a predetermined maximum voltage, or if the voltage and current across the transistor jointly violate a predetermined safe-operating-area relationship; and a second protection circuit connected to monitor voltage and current across the transistor, and to drive the transistor at a predetermined non-zero minimum current level if the first protection circuit is attempting to turn the transistor off while the voltage across the transistor is less than the predetermined maximum voltage; the transistor and the protection circuits all being integrated together.

According to another disclosed class of innovative embodiments, there is provided: A circuit for preventing the occurrence of the latch-down phenomenon in a transistor protected from moving out of its safe operating area by a protection circuit, comprising: a) a detector means effective to detect the current which is flowing through the main conduction path of the transistor, and b) a control means CM effective to drive the control terminal of the transistor such that, when upon the voltage across the path being increased the value of the current flowing through the path tends, because of that protection, to drop below a predetermined lower limit, that value is kept approximately constant and unaffected by the load as seen from the output terminal of the transistor; wherein the detector means is effective to generate a first voltage signal whose amplitude is substantially proportional to the current flowing through the path, and wherein the control means comprises: a) a reference current generator; b) a reference resistor connected to the output of the current generator; c) a voltage comparator of the type having a current differential output and inputs respectively coupled to the output of the detector means and the terminals of the reference resistor; d) a current mirror connected to the outputs of the comparator; and e) an output stage having an input connected to one of the comparator outputs and an output coupled to the control terminal of the transistor.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

For another example, some temperature dependence can intentionally be introduced into ISC and/or VMAX, in alternative embodiments, to optimally compensate any temperature-dependence of the SOA.

What is claimed is:

1. A method for operating a bipolar transistor, comprising the steps of:
   (a.) monitoring voltage and current levels of said transistor;
   (b.) if the current exceeds a maximum current, turning off said transistor;
   (c.) if the voltage exceeds a maximum voltage, turning off said transistor;
   (d.) if conditions (b.) and (c.) do not exist, and if the voltage and current levels violate a safe-operating-area relationship, then partially turning off said transistor, to reduce the current to a level no less than a non-zero minimum level.

2. The method of claim 1, wherein said safe-operating-area relationship is defined by a protection circuit which includes a resistor-diode branch.

3. The method of claim 1, wherein said safe-operating-area relationship is temperature-dependent.

4. The method of claim 1, wherein said non-zero minimum current level is maintained by a negative feedback relationship.

5. A method for operating a bipolar transistor, comprising the steps of:
   (a.) monitoring voltage and current levels of said transistor;
   (b.) if the current exceeds a maximum current, turning off said transistor;
   (c.) if the voltage exceeds a maximum voltage, turning off said transistor;
   (d.) providing emitter, base, and collector voltages from said transistor to a protection circuit, which provides an output signal which indicates whether a violation of a safe-operating-area relationship has occurred; and if said output signal indicates that a violation of a safe-operating-area relationship has occurred, then partially turning off said transistor, to bring the current to a level greater than a non-zero minimum level.

6. The method of claim 5, wherein said protection circuit includes a resistor-diode branch.

7. The method of claim 5, wherein said non-zero minimum current level is maintained by a negative feedback relationship.

8. The method of claim 5, wherein said safe-operating-area relationship is temperature-dependent.

9. A method for preventing the occurrence of the latch-down phenomenon in a transistor protected from moving out of its safe operating area, when the value of the current flowing through the main conduction path of the transistor tends, because of that protection, to drop below a lower limit as the voltage across said path increases, a drive signal is applied to the control terminal of the transistor which keeps that value approximately constant and unaffected by the load as, said value being held until the value of the voltage across said path exceeds an upper break-down limit.

10. A method according to claim 9, wherein said drive signal is discontinued when the value of the current flowing through said path tends to rise above said lower limit.

11. A method according to claim 9, wherein said drive signal is only applied when the value of the voltage across said path exceeds a lower operation limit.

12. An integrated circuit, comprising:
   a bipolar power transistor;
   a first protection circuit coupled with said transistor and operable to monitor voltage and current levels of said transistor, and to attempt to turn off said transistor if the current exceeds a maximum current, or if the voltage exceeds a maximum voltage, or if the voltage and current jointly violate a safe-operating-area relationship; and
   a second protection circuit coupled with said transistor and operable to monitor voltage and current levels of said transistor, and to drive said transistor at a non-zero minimum current level if said first protection circuit is attempting to turn said transistor off while the voltage across said transistor is less than said maximum voltage.

13. The integrated circuit of claim 12, wherein said first protection circuit includes a resistor-diode branch.

14. The integrated circuit of claim 12, wherein said non-zero minimum current level is maintained by a negative feedback relationship.

15. The integrated circuit of claim 12, wherein said safe-operating-area relationship is temperature-dependent.

16. An integrated circuit for controlling a power bipolar transistor which has a current-sensing resistor in series therewith, comprising:
- connections for the emitter, base, and collector of the power transistor, and for the current-sensing resistor;
- a first protection circuit coupled with the connections and operable to monitor voltage and current levels of said transistor, and to attempt to turn off said transistor if the current exceeds a maximum current, or if the voltage exceeds a maximum voltage, or if the voltage and current jointly violate a safe-operating-area relationship; and
- a second protection circuit coupled with the connections and operable to monitor voltage and current levels of said transistor, and to drive said transistor at a non-zero minimum current level if said first protection circuit is attempting to turn said transistor off while the voltage across said transistor is less than said maximum voltage.

17. The integrated circuit of claim 16, wherein said first protection circuit includes a resistor-diode branch.

18. The integrated circuit of claim 16, wherein said non-zero minimum current level is maintained by a negative feedback relationship.

19. The integrated circuit of claim 16, wherein said safe-operating-area relationship is temperature-dependent.

20. A circuit for preventing the occurrence of the latch-down phenomenon in a transistor protected from moving out of its safe operating area by a protection circuit, comprising:
- a detector means coupled with the transistor and operable to detect the current which is flowing through the main conduction path of the transistor; and
- a control means coupled with the transistor and the detector means and operable to drive the transistor such that, when said protection circuit causes the value of the current flowing through said path to drop below a lower limit as the voltage across said path increases, that value is kept approximately constant, said control means operating only when the value of the voltage across said path exceeds a lower operation limit.

21. A circuit according to claim 20, wherein said detector means is operable to produce a first voltage signal whose amplitude is substantially proportional to the current flowing through said path, and wherein said control means comprises:
a) a reference current generator;
b) a reference resistor connected to the output of said current generator;
c) a voltage comparator having a current differential output and inputs respectively coupled to the output of said detector means and the terminals of said reference resistor;
d) a current mirror connected to the outputs of said comparator; and
e) an output stage having an input connected to one of said comparator outputs and an output coupled to the control terminal of the transistor.

22. A circuit according to claim 21, wherein said reference current generator is operable to produce two substantially identical currents at two outputs thereof respectively connected to the two inputs of said comparator, and wherein, respectively placed in series with said reference resistor and in series with the output of said detector means, are two bias resisters having substantially the same resistive value and being adapted to provide bias for said comparator and to pre-charge it relative to the occurrence of said decrease.

23. A circuit according to claim 21, wherein said control means is substantially supplied by the voltage value across said path.

24. A voltage regulator operable to receive an input voltage and produce a regulated output voltage, comprising:
- a transistor operable to produce the output voltage;
- a first protection circuit coupled to the transistor and operable to control operation of the transistor within a safe operating area; and
- a second protection circuit coupled to the transistor and operable to maintain a current level in the transistor above a minimum non-zero level within the safe operating area.

25. The voltage regulator of claim 24, further including a detector coupled with the transistor and operable to produce a voltage corresponding to the current level in the transistor, and wherein the second protection circuit includes:
- a reference current generator;
- a reference resistor coupled with the output of said current generator; and
- a voltage comparator coupled with the detector, with the reference resistor, and with the transistor, the comparator being operable to produce an output signal indicative of the relative values of the voltage produced by the detector and the voltage across the reference resistor, the output signal controlling operation of the transistor to maintain, within the safe operating area, the current level in the transistor no less than the minimum non-zero level.

26. The voltage regulator of claim 25, wherein the voltage comparator includes differential outputs and inputs, and wherein the second protection circuit further includes:
- a current mirror coupled with the differential outputs of the comparator; and
- an output stage coupling one of the differential outputs of the comparator with the transistor.

27. The voltage regulator of claim 25, wherein the reference current generator is operable to generate two substantially identical currents at two outputs thereof respectively connected to the two differential inputs of the comparator, and wherein two bias resistors having substantially the same resistive value are respectively placed in series with the reference resistor and with the detector, the bias resistors being operable to bias and precharge the comparator.

28. The voltage regulator of claim 25 wherein the second protection circuit is substantially supplied by the voltage across the main conduction path of the transistor.

29. The voltage regulator of claim 25, wherein the second protection circuit operates only when the voltage across the main conduction path of the transistor exceeds a lower limit.

30. The voltage regulator of claim 24, further comprising:
- a reference voltage generator operable to receive the input voltage and to produce a reference voltage in response thereto; and
- an error control amplifier coupled with the transistor and with the reference voltage generator, the error control amplifier being operable to produce an output signal indicative of the relative values of the reference and output voltages to regulate operation of the transistor.

* * * * *